United States Patent
Schroeder et al.

(10) Patent No.: US 6,822,498 B1
(45) Date of Patent: Nov. 23, 2004

(54) CLOCK DISTRIBUTION SYSTEM FOR AUTOMATIC TEST EQUIPMENT

(75) Inventors: Duane A. Schroeder, Blaine, MN (US); Jack Kretchmer, Coon Rapids, MN (US); Jacob A. Salmi, Andover, MN (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/461,568

(22) Filed: Jun. 12, 2003

(51) Int. Cl.[7] .............................................. G06F 1/04
(52) U.S. Cl. ...................... 327/291; 327/293; 327/295
(58) Field of Search .............................. 327/291, 292, 327/293, 295; 713/400, 500, 503, 600; 324/76.39; 333/109, 142, 143, 150, 151

(56) References Cited

U.S. PATENT DOCUMENTS 5,293,626 A * 3/1994 Priest et al. ................. 713/401
6,098,176 A * 8/2000 Coteus et al. ................ 713/400
6,294,933 B1 * 9/2001 Chun et al. .................... 326/86
6,433,605 B1 * 8/2002 Zhang .......................... 327/291
6,452,442 B1 * 9/2002 Laude .......................... 327/551

* cited by examiner

*Primary Examiner*—Tuan T. Lam
(74) *Attorney, Agent, or Firm*—Teradyne Legal Department

(57) ABSTRACT

A clock system for providing a high-speed clock signal to a plurality of integrated circuits is disclosed. The clock system includes an analog signal generator for producing a periodic analog signal of a predetermined frequency and fanout circuitry. The fanout circuitry is coupled to the analog signal generator and includes a transmission line and an RF coupler. The system further includes a plurality of receivers. Each receiver has reference signal input circuitry and clock signal input circuitry. Both the reference signal circuitry and the clock signal circuitry are receptive to coupling locally generated common mode noise. The clock signal circuitry is disposed proximate the RF coupler to provide an RF coupling therebetween.

14 Claims, 3 Drawing Sheets

CLOCK DISTRIBUTION SYSTEM FOR AUTOMATIC TEST EQUIPMENT

FIELD OF THE INVENTION

The invention relates generally to automatic test equipment, and more specifically to clock distribution systems for automatic test equipment.

BACKGROUND OF THE INVENTION

Automatic test equipment enables semiconductor device manufactures to test newly fabricated devices in a manufacturing setting. The equipment typically drives test signals to and receives response signals from a device-under-test. The response signals are then compared to expected signals to determine if the device passed or failed the test.

Like the semiconductor devices they test, automatic test equipment involves a high degree of sophisticated circuitry. The circuitry is typically employed in the form of integrated circuits that define "channels" for the automatic test equipment, or tester. Generally, each channel is controlled by a clock in the tester. For each period of the tester clock, each channel can generate or measure the signal. Consequently, the quality, or accuracy of the tester clock plays an important role in the ability of the tester to identify passing or failing devices.

As device speeds increase, the tester clocks also typically increase. Whereas conventional test signals on the order of less than one gigahertz could successfully be distributed to the channel circuitry over long distances, higher frequency signals on the order of one or more gigahertz tend to attenuate even over relatively short distances.

One potential solution to preserve the clock integrity is to distribute the clock as a differential digital signal to the tester channel IC's. Unfortunately, at 800 megahertz and beyond, standard differential signals drift apart over three-hundred centimeters, and are no longer differential at the destination. Moreover, the digital circuitry typically employed to generate and drive the differential clock often produces undesirable distortion that affects the accuracy of the signal. Another problem with this approach is that if the source signal includes noise components, there is no common-mode rejection of the source noise.

Another possible solution is to avoid the differential approach and instead drive a single-ended signal along the fanout transmission line. However, single-ended signals are susceptible to locally generated and ASIC generated common mode noise.

What is needed and currently unavailable is a clock distribution system that allows for relatively long fanout lengths while maintaining optimal clock signal integrity. The clock distribution system of the present invention satisfies these needs.

SUMMARY OF THE INVENTION

The clock distribution system of the present invention provides a unique way of fanning out a high frequency clock signal to a plurality of integrated circuits with minimal distortion. In addition, the invention advantageously provides simultaneous rejection of locally generated common-mode noise. By providing a relatively distortion-free clock signal, higher accuracy in the integrated circuit timings are realized.

To realize the foregoing advantages, the invention in one form comprises a clock system for providing a high-speed clock signal to a plurality of integrated circuits. The clock system includes an analog signal generator for producing a periodic analog signal of a predetermined frequency and fanout circuitry. The fanout circuitry is coupled to the analog signal generator and includes a transmission line and an RF coupler. The system further includes a plurality of receivers. Each receiver has reference signal input circuitry and clock signal input circuitry. Both the reference signal circuitry and the clock signal circuitry are receptive to coupling locally generated common mode noise. The clock signal circuitry is disposed proximate the RF coupler to provide an RF coupling therebetween.

In another form, the invention comprises a clock system for providing a high-speed clock signal to a plurality of integrated circuits. The clock system includes means for producing a periodic analog signal of a predetermined frequency and means for fanning out the periodic analog signal. The system further includes a plurality of receivers. Each receiver has means for receiving a reference input signal and means for receiving a clock input signal. Both the means for receiving a reference input signal and the means for receiving a clock input signal are receptive to coupling locally generated common mode noise. The system additionally includes means for RF coupling the periodic analog signal to the means for receiving a clock input signal.

In a further form, the invention comprises a method of distributing a high-frequency clock signal to a plurality of receivers. Each receiver has a clock input and a reference input. The method includes the steps: driving a single-ended analog periodic signal along a transmission line path; RF-coupling the single-ended signal to the clock input at a point proximate the clock input; and mutually coupling locally generated common-mode noise between the reference input and the clock input.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
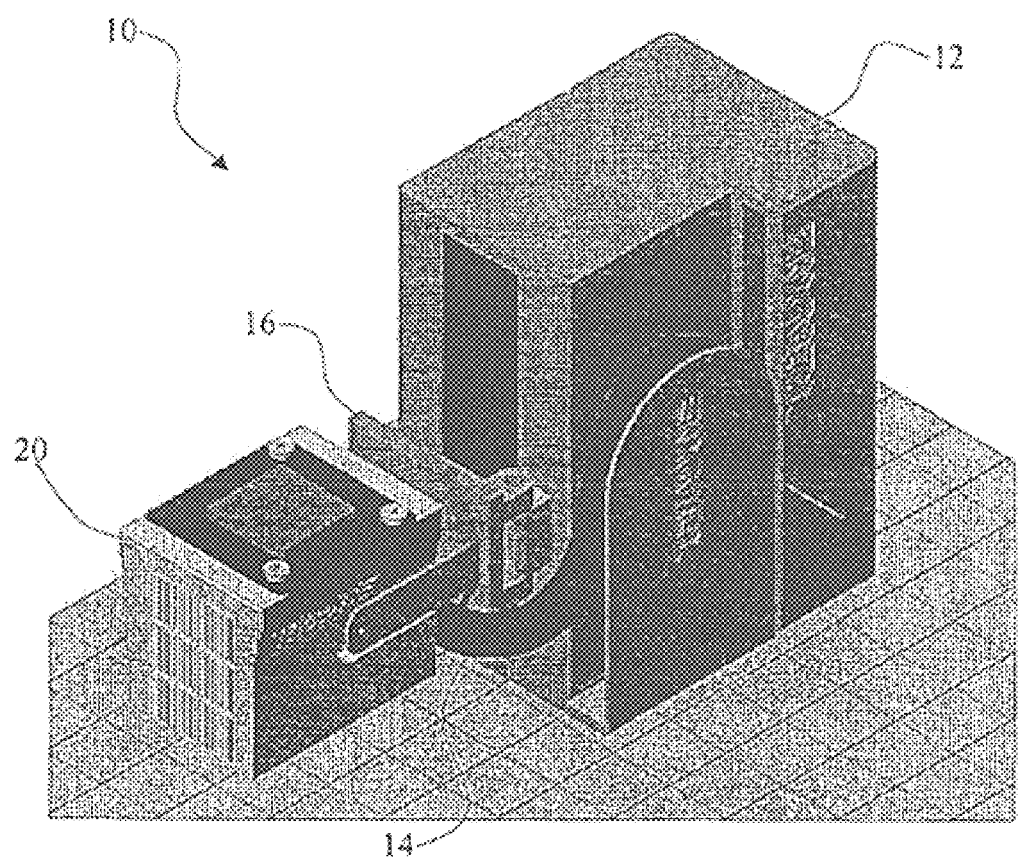
FIG. 1 is an elevated perspective view of a semiconductor tester according to one form of the present invention.

Referring now to FIG. 1, a semiconductor tester in accordance with one form of the present invention, generally designated 10, includes a main console 12 to house various electronic sub-assemblies that support the operation of a plurality of tester instruments (not shown) disposed in a testhead 20. The testhead couples to the console via a cable bundle 14 and serves as an extension of the tester in an effort to place the tester instruments as close to one or more devices-under-test (DUTs) (FIG. 2, 32) as possible. A manipulator 16 disposed adjacent the console carries and positions the testhead with respect to a handling apparatus (not shown), such as a packaged-device handler or wafer prober. A sophisticated interface assembly (not shown) connects the testhead to the DUT via an arrangement of coaxial cables, circuit boards, and wafer probes (or, for packaged device testing, sockets).

The tester instrument boards, often referred to as "channel cards", are adapted for installation within the testhead 20 and resemble large rectangular circuit boards. Each channel card may provide hardware and software resources for anywhere from sixteen to one-hundred twenty-eight channels. The cards may comprise digital instruments such as waveform digitizers, digital signal generators, analog instruments such as RF signal generators and other analog waveform analyzers, memory test instrumentation or the like.

The instruments, in turn, are formed from respective collections of integrated circuits, or ICs. In many instances, the ICs are mounted in packages commonly referred to as multi-chip modules, or MCMs (shown as an example in FIG. 3, and denoted as 36). With this in mind, the present invention is directed to a clock distribution circuit for distributing a high frequency clock signal to the ICs with minimal attenuation or distortion.

Figure 2:
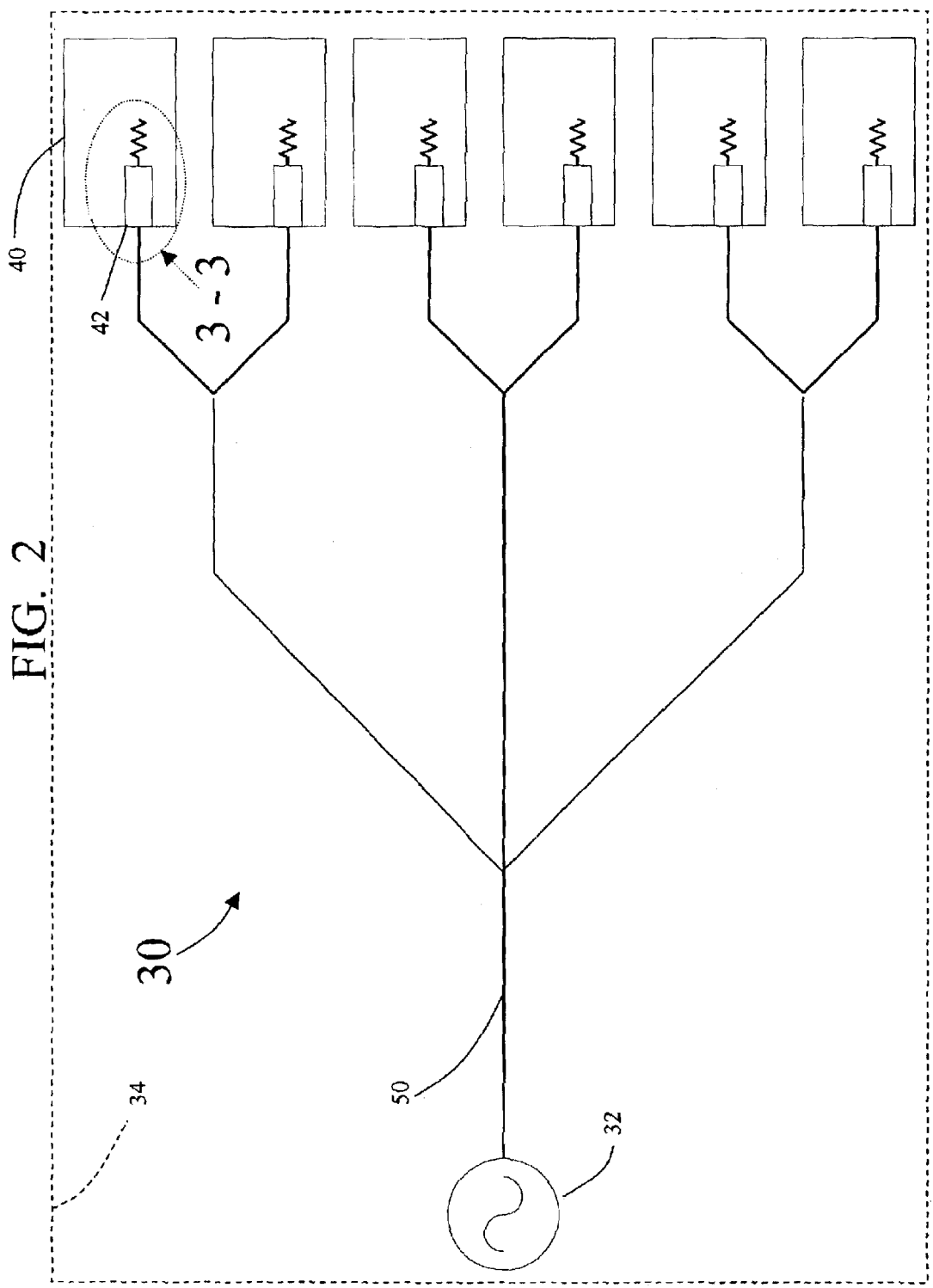
FIG. 2 is a clock distribution system for use in the semiconductor tester of FIG. 1.
Figure 3:
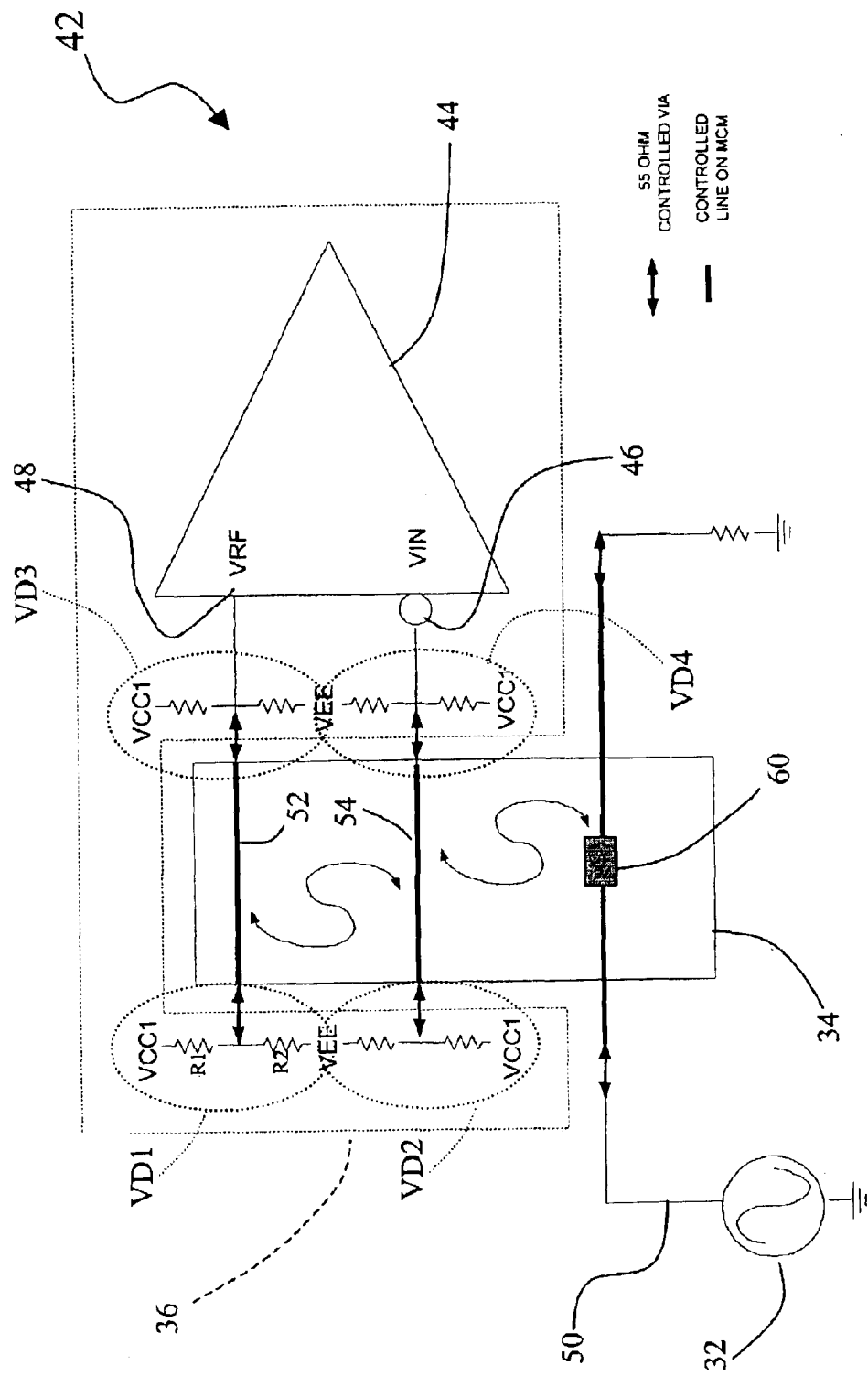
FIG. 3 is a block diagram close-up view of the area identified as 3—3 in FIG. 2.

With reference to FIGS. 2 and 3, the clock distribution system of the present invention, generally designated 30, advantageously employs both single-ended and differential transmission techniques in order to distribute a low jitter clock from a clock source 32 with minimal distortion to a plurality of integrated circuits 40 having respective clock inputs 42. For applications such as automatic test equipment, such as that illustrated in FIG. 1, this scheme maximizes timing accuracy for the tester timing circuits by ensuring a highly accurate master clock signal.

Further referring to FIGS. 2 and 3, the clock source 32 preferably comprises an analog signal generator disposed on a circuit board 34 (such as, for example, an instrument board as described above). The signal generator is of the type capable of producing a periodic pure tone sine wave at frequencies above one gigahertz. The periodic signal is preferably transmitted as a single-ended signal (as contrasted with a differential signal having a first signal component and its complement transmitted across a pair of transmission lines). The single-ended approach avoids duty-cycle control problems that commonly arise in differential signal transmission schemes over relatively long transmission lengths.

As alluded to above, to distribute the single-ended analog clock signal to each IC 40, fanout circuitry 50 in the form of a single-ended transmission line network is employed over most of the clock signal path. Transmission line constructions, such as those formed as microstrip traces on printed circuit boards, or coaxial cables, are well known to those skilled in the art.

One of the advantages in driving an analog signal along the single-ended transmission line 50 is the ability to maintain a high level of signal quality over relatively long transmission line lengths. The drawback, however, often involves the addition of locally generated noise added to the clock signal at the IC clock input 42. The noise typically arises from noise sources such as power supplies, uncontrolled crosstalk between channels, and so forth.

Referring now to FIG. 3, the inventors have succeeded in minimizing the locally generated common mode noise problem by configuring each IC clock input 42 as a quasi-differential receiver 44. Each receiver includes an inverted clock input port 46 and a non-inverted reference port 48. Both ports are coupled to short lengths of equidistant transmission lines 52 and 54 and are exposed to any IC common mode noise. In this manner, the sum of the input noise components at the receiver cancel out (due to the inverted clock input).

To further balance the signals at the input of the receiver 44, and maintain an optimal DC-bias, biasing circuitry in the form of voltage dividers VD1–VD4 are disposed on each end of the equidistant transmission line paths 52 and 54. The first voltage divider VD1 includes a pair of series-connected resistors R1, R2 that are coupled to positive and negative voltage source rails VCC and VEE, respectively. The other dividers VD2–VD4 are formed similarly, thus warranting no further description.

To enjoy the benefit of the local common-mode noise rejection described above, yet enable the delivery of the clock signal to the receiver clock input port 46, the fanout circuitry 50 is brought within a short range of the inverted clock input (preferably approximately 20 millimeters), and the clock signal is RF coupled to the input via a quarter-wave directional coupler 60.

In a preferred embodiment, the quarter-wave directional coupler 60 comprises a discrete component available, for example, as model CSD-10H-1.5G manufactured by Merrimac Industries, Inc., of West Caldwell, N.J. The coupler provides very good jitter performance while minimizing circuit real estate for the IC. Moreover, the coupler provides a beneficial band-pass filtering capability to further enhance the clock signal fidelity.

In a further advantageous aspect of the presently described embodiment, the inventors have succeeded in implementing the delivery of the clock signal and configuring the receiver 44 by using existing trace paths on the instrument board 34.

For instance, in multi-chip module packaging schemes, such as that represented by MCM 36 (where multiple ICs are mounted within one ceramic package) a controlled transmission line may be utilized in the MCM package in cooperation with existing controlled vias (represented in FIG. 3 by double-sided arrows) coupling the MCM package to the IC terminals (not shown). By using existing traces and vias, the cost to implement the clock distribution system is greatly reduced.

In operation, the clock signal generator 32 delivers a pure-tone analog sine wave at a predetermined frequency within a designated range, preferably between one to two gigahertz. The signal propagates along the single-ended transmission line 50, preferably no more than around three-hundred centimeters in length. The signal then fans out to the plurality of ICs 40 through the mutual coupling of the quarter-wave coupler 60 and the IC clock signal input 46.

While the clock signal is delivered to the IC clock input 46, an inverted noise component is also captured via the short clock input transmission line 54.

Simultaneously, the same noise is also coupled via the non-inverted reference input transmission line 52. The combined inputs form a quasi-differential signal at the combined receiver inputs 46 and 48, thus cancelling-out any common-mode noise components.

The resulting captured clock signal then serves as the clock for synchronizing the timing activities within the IC. For high-performance ATE timing applicaitons, the low-jitter distortion-free clock signal enables high accuracy timing signals for which to test semiconductor devices.

Those skilled in the art will recognize the many benefits and advantages afforded by the present invention. Of significant importance is the distribution of the analog clock signal via a single-ended transmission line over a majority of the signal path and RF-coupling the signal to the destination port proximate the output. Moreover, by treating the clock receiver as a quasi-differential receiver, locally generated common-mode noise may be eliminated, thus improving the clock signal integrity.

While the invention has been particularly shown and described with reference to the preferred embodiments thereof, it will be understood by those skilled in the art that various changes in form and detail may be made therein without departing from the spirit and scope of the invention.

What is claimed is:

1. A clock system for providing a high-speed clock signal to a plurality of integrated circuits, the clock system including:
    an analog signal generator for producing a periodic analog signal of a predetermined frequency;
    fanout circuitry coupled to the analog signal generator and including a transmission line and an RF coupler;
    a plurality of receivers, each receiver having
        reference signal input circuitry and
        clock signal input circuitry, both the reference signal circuitry and the clock signal circuitry receptive to coupling locally generated common mode noise, the clock signal circuitry disposed proximate the RF coupler to provide an RF coupling therebetween;
    whereby the periodic analog signal propagates along the fanout circuitry and is RF coupled to the clock signal input of each receiver with minimal attenuation or distortion.

2. A clock system according to claim 1 wherein:
the transmission line is single-ended.

3. A clock system according to claim 1 wherein:
the periodic analog signal is a pure-tone sine wave.

4. A clock system according to claim 1 wherein:
the predetermined frequency is in the range of frequencies between one and two gigahertz.

5. A clock system according to claim 1 wherein:
the RF coupler comprises a quarter-wave directional coupler.

6. A clock system according to claim 1 wherein:
the fanout circuitry transmission line is at least approximately three-hundred centimeters.

7. A clock system according to claim 1 wherein:
the RF coupler is disposed approximately twenty millimeters from the receiver clock input circuitry.

8. A clock system for providing a high-speed clock signal to a plurality of integrated circuits, the clock system including:
    means for producing a periodic analog signal of a predetermined frequency;
    means for fanning out the periodic analog signal;
    a plurality of receivers, each receiver having
        means for receiving a reference input signal and
        means for receiving a clock input signal, both the means for receiving a reference input signal and the means for receiving a clock input signal receptive to coupling locally generated common mode noise; and
    means for RF coupling the periodic analog signal to the means for receiving a clock input signal.

9. A clock system according to claim 8 wherein the means for producing a periodic analog signal comprises:
    an analog signal generator.

10. A clock system according to claim 8 wherein the means for RF coupling the periodic analog signal to the means for receiving a clock input signal comprises:
    a quarter-wave directional coupler.

11. A clock system according to claim 8 wherein:
    the means for fanning out includes a single-ended transmisison line.

12. A method of distributing a high-frequency clock signal to a plurality of receivers, each receiver having a clock input and a reference input, the method including the steps:
    driving a single-ended analog periodic signal along a transmission line path;
    RF-coupling the single-ended signal to the clock input at a point proximate the clock input; and
    quasi-differentially coupling locally generated common-mode noise between the reference input and the clock input.

13. A method according to claim 12 wherein the driving step includes the step:
    driving the analog periodic signal along a single-ended transmission line.

14. A method of manufacturing a semiconductor device including the steps:
    selecting automatic test equipment having a clock distribution system including
        an analog signal generator for producing a periodic analog signal of a predetermined frequency;
        fanout circuitry coupled to the analog signal generator and including a transmission line and an RF coupler;
        a plurality of receivers, each receiver having
            reference signal input circuitry and
            clock signal input circuitry, both the reference signal circuitry and the clock signal circuitry receptive to coupling locally generated common mode noise, the clock signal circuitry disposed proximate the RF coupler to provide an RF coupling therebetween; and
    testing the semiconductor device with the automatic test equipment.

* * * * *